US009563482B2

(12) United States Patent
Bivens, II et al.

(10) Patent No.: US 9,563,482 B2
(45) Date of Patent: *Feb. 7, 2017

(54) METHOD FOR IMPOSING POLICY MODIFICATION CONSTRAINTS

(75) Inventors: John A. Bivens, II, Ossining, NY (US); David L. Kaminsky, Chapel Hill, NC (US)

(73) Assignee: International Business Machines Corporation, Armonk, NY (US)

(*) Notice: Subject to any disclaimer, the term of this patent is extended or adjusted under 35 U.S.C. 154(b) by 1368 days.

This patent is subject to a terminal disclaimer.

(21) Appl. No.: 12/181,906

(22) Filed: Jul. 29, 2008

(65) Prior Publication Data

US 2008/0288544 A1    Nov. 20, 2008

Related U.S. Application Data

(63) Continuation of application No. 10/794,372, filed on Mar. 5, 2004, now Pat. No. 7,433,892.

(51) Int. Cl.
| | | |
|---|---|---|
| *G06F 17/30* | (2006.01) | |
| *G06F 7/00* | (2006.01) | |
| *G06F 9/50* | (2006.01) | |
| *G06F 11/30* | (2006.01) | |
| *G06F 17/50* | (2006.01) | |

(52) U.S. Cl.
CPC ............ *G06F 9/5083* (2013.01); *G06F 9/50* (2013.01); *G06F 11/3006* (2013.01); *G06F 11/3058* (2013.01); *G06F 17/509* (2013.01)

(58) Field of Classification Search
USPC ............... 707/104.1, 101, 102, 802; 709/226
See application file for complete search history.

(56) References Cited

U.S. PATENT DOCUMENTS

| | | | | |
|---|---|---|---|---|
| 4,890,227 A | * | 12/1989 | Watanabe et al. | 706/14 |
| 6,473,791 B1 | * | 10/2002 | Al-Ghosein et al. | 709/217 |
| 6,765,864 B1 | * | 7/2004 | Natarajan et al. | 370/224 |
| 6,922,754 B2 | * | 7/2005 | Liu et al. | 711/138 |
| 6,990,437 B1 | * | 1/2006 | Abu El Ata | 703/2 |
| 7,689,684 B2 | * | 3/2010 | Donoho et al. | 709/224 |
| 2003/0023880 A1 | | 1/2003 | Edwards et al. | |
| 2003/0046396 A1 | * | 3/2003 | Richter et al. | 709/226 |
| 2003/0095144 A1 | * | 5/2003 | Trevino et al. | 345/764 |

(Continued)

OTHER PUBLICATIONS

Bivens II et al., U.S. Appl. No. 10/794,372, filed Mar. 5, 2004, USPTO Non-Final Office Action Communication, Dec. 21, 2006, 18 pages.

(Continued)

*Primary Examiner* — Kuen Lu
(74) *Attorney, Agent, or Firm* — Steven M. Greenberg, Esq.; CRGO Law

(57) ABSTRACT

Meta data specifying modification constraints for one or more of the attributes of an (operational) policy is generated/provided. Thereafter, the meta data is associated with the policy so that the constraints specified by the meta data can govern the modification of the policy. Under the present invention there are at least two ways of associating the meta data with a policy. In one embodiment, the meta data is embodied as a meta policy that can be associated with one or more (operational) policies. In another embodiment, the meta data is inserted into individual policies as additional attributes.

14 Claims, 3 Drawing Sheets

(56) References Cited

U.S. PATENT DOCUMENTS

| | | | |
|---|---|---|---|
| 2003/0110192 A1 | 6/2003 | Valente et al. | |
| 2004/0093381 A1* | 5/2004 | Hodges et al. | 709/204 |
| 2004/0117290 A1* | 6/2004 | Shacham | 705/37 |
| 2004/0123145 A1* | 6/2004 | Baffes et al. | 713/201 |
| 2004/0143428 A1* | 7/2004 | Rappaport et al. | 703/22 |

OTHER PUBLICATIONS

Bivens II et al., U.S. Appl. No. 10/794,372, filed Mar. 5, 2004, USPTO Non-Final Office Action Communication, May 31, 2007, 16 pages.
Bivens II et al., U.S. Appl. No. 10/794,372, filed Mar. 5, 2004, USPTO Final Office Action Communication, Nov. 6, 2007, 12 pages.
INSPEC, AN 6976612, Kim et al., "Exploiting Metadata of Absent Objects for Proxy Cache Consistency", IEICE Transactions on Communications, vol. E84-B, No. 5, pp. 1406-1412, May 2001.
Braumandl et al., "ObjectGlobe: Ubiquitous Query Processing on the Internet", The VLDB Journal 10: 48-71(2001).
Denys et al., "A Survey of Customizability in Operating Systems Research", ACM Computing Surveys, vol. 34, No. 4, Dec. 2002, pp. 450-468.
Dewan et al., "Flexible Meta Access-Control for Collaborative Applications", pp. 247-256, 1998.
Suryanarayana et al., "Profiles for the Situated Web", pp. 200-209, 2002.
IEEE Xplore, "( ((modification )<in>metada ) <and> ((constraint)<in>metadata) )<and> ((metadata)<in> . . . ", May 2008, 1 page.
IEEE Xplore, "( ((modification )<in>metada ) <and> ((constraint)<in>metadata) )<and> ((policy)<in> . . .", May 2008, 4 page.
Google, "meta data generation specifying attributes policy assocate modification constraint . . . ", Web Results 1-100 or 104, May 2008, 14 pages.
Google, "meta data generation specifying attributes policy assocate modification constraint . . . ", Web Results 101-104 of 104, May 2008, 2 pages.
Google, "meta data generation specifying "modification constraint" attributes policy", Web Results 1-8 of 8, May 2008, 2 pages.
ACM Portal USPTO, "(computer and infrastructure and modification and constraint and metadata and generation and association)", Results 1-20 of 87, May 2008, 9 pages.
ACM Portal USPTO, "(computer and infrastructure and modification and constraint and metadata and generation and association)", Results 21-40 of 87, May 2008, 9 pages.
ACM Portal USPTO, "(computer and infrastructure and modification and constraint and metadata and generation and association)", Results 41-60 of 87, May 2008, 9 pages.
ACM Portal USPTO, "(computer and infrastructure and modification and constraint and metadata and generation and association)", Results 61-80 of 87, May 2008, 9 pages.
ACM Portal USPTO, "(computer and infrastructure and modification and constraint and metadata and generation and association)", Results 81-87 of 87, May 2008, 4 pages.

* cited by examiner

METHOD FOR IMPOSING POLICY MODIFICATION CONSTRAINTS

REFERENCE TO PRIOR APPLICATIONS

This application is a continuation application of U.S. patent application Ser. No. 10/794,372, filed on Mar. 5, 2004, now U.S. Pat. No. 7433892 which is hereby incorporated by reference.

BACKGROUND OF THE INVENTION

1. Field of the Invention

In general, the present invention relates to a method, system and program product for imposing policy modification constraints. Specifically, the present invention provides a more effective way to control the modification of operational policies for computer infrastructures.

2. Related Art

As the use of computer infrastructures becomes more pervasive, there is a growing need to implement policies governing their operation/performance. For example, a given infrastructure might have a collection of servers, clients, databases, etc. In such a case, there is a need to ensure optimal operation of the computer infrastructure. For example, there might be a need to provide load balancing among the servers so that one server does not become overloaded. To this extent, a certain policy might require that workload be shifted to a second server when the CPU consumption of a first server reaches a certain threshold. In many cases, a typical policy has at least four attributes, namely, scope, precondition, decision and business value. The scope attribute generally specifies the intended target of the policy. That is, the scope specifies the element of the computer infrastructure (e.g., server, database, etc.) to which the policy is to be applied. The precondition attribute specifies when the policy is to be applied. For example, a policy might be applied when CPU consumption reaches a certain threshold, when recovery time for a system becomes too high, etc. The decision attribute specifies an action to be taken if the precondition occurs. For example, if the precondition attributes specifies a CPU consumption of 60% for a particular server, the decision attribute could require shifting workload to a different server when the 60% is reached or exceeded. Lastly, the business value attribute specifies a business value for the policy. This allows a priority to be determined when more than one policies are applicable.

Once a policy has been established, it can be implemented autonomically using one or more autonomic managers. However, one issue that arises with policies is the modification thereof. Specifically, there is often the need to modify a given policy in light of changes to the computer infrastructure. For example, one policy might state that a minimum of three servers needs to be operational within the infrastructure at all times. If the minimum number of operational servers is not met, the corrective action could be to reduce server recovery time from 10 minutes to 5 minutes. Accordingly, modification of the policy calling for the reduction in recovery time to 5 minutes is needed.

To date, policies are largely modified manually by an administrator or by autonomic managers controlling the system. Neither option is preferred since different administrators or autonomic managers could have a different knowledge of the true constraints of the infrastructure. Moreover, the administrators or autonomic managers would make such changes without full knowledge of valid ranges for the policy. For example, assume under the above scenario that a recovery time of less than 7.5 minutes is not feasible. The administrator would have to know this or risk further degradation of the system.

In view of the foregoing, there exists a need for a method, system and program product for imposing policy modification constraints. Specifically, a need exists for a system that allows policies to be associated with any modification constraints corresponding thereto.

SUMMARY OF THE INVENTION

In general, the present invention provides a method, system and program product for imposing policy modification constraints. Specifically, under the present invention meta data specifying modification constraints for one or more of the attributes of an (operational) policy is generated/provided. Thereafter, the meta data is associated with the policy so that the constraints specified by the meta data can govern the modification of the policy. Under the present invention there are at least two ways of associating the meta data with a policy. In one embodiment, the meta data is embodied as a meta policy that can be associated with one or more (operational) policies. In another embodiment, the meta data is inserted into individual policies as additional attributes.

A first aspect of the present invention provides a method for imposing policy modification constraints, comprising: providing a policy pertaining to operational performance of a computer infrastructure, wherein the policy comprises a set of the attributes; and associating meta data with the policy, wherein the meta data specifies at least one modification constraint governing modification of at least one of the set of attributes.

A second aspect of the present invention provides a computer-implemented method for imposing policy modification constraints, comprising: providing a policy pertaining to operational performance of a computer infrastructure, wherein the policy comprises at least one of attributes of scope, precondition, decision and business value; generating meta data that specifies at least one modification constraint governing modification of at least one of the attributes; and associating meta data with the policy, wherein the meta data specifies at least one modification constraint governing modification of at least one of the set of attributes.

A third aspect of the present invention provides a system for imposing policy modification constraints, comprising: a meta data generation system for generating meta data specifying at least one modification constraint governing modification of at least one of a set of attributes present in a policy pertaining to operation of a computer infrastructure; and an association system for associating the meta data with the policy.

A fourth aspect of the present invention provides a program product stored on a recordable medium for imposing policy modification constraints, which when executed, comprises: program code for generating meta data specifying at least one modification constraint governing modification of at least one of a set of attributes present in a policy pertaining to operation of a computer infrastructure; and program code for associating the meta data with the policy.

Therefore, the present invention provides a method, system and program product for imposing policy modification constraints.

BRIEF DESCRIPTION OF THE DRAWINGS

These and other features of this invention will be more readily understood from the following detailed description of the various aspects of the invention taken in conjunction with the accompanying drawings in which.

Figure 1:
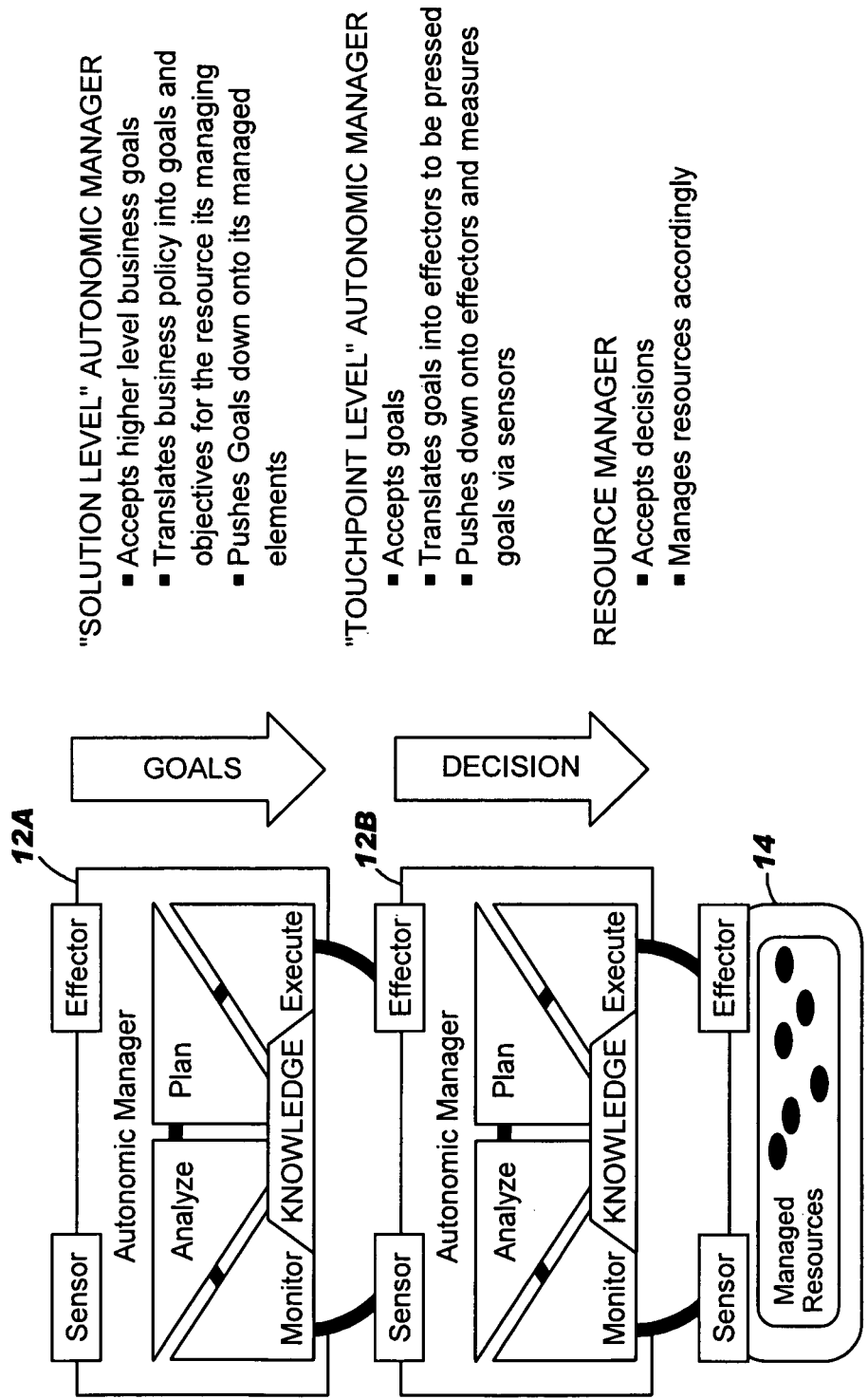
FIG. 1 depicts an illustrative technique for implementing a policy.

It is noted that the drawings of the invention are not necessarily to scale. The drawings are merely schematic representations, not intended to portray specific parameters of the invention. The drawings are intended to depict only typical embodiments of the invention, and therefore should not be considered as limiting the scope of the invention. In the drawings, like numbering represents like elements.

DETAILED DESCRIPTION OF THE DRAWINGS

As indicated above, the present invention provides a method, system and program product for imposing policy modification constraints. Specifically, under the present invention meta data specifying modification constraints for one or more of the attributes of an (operational) policy is generated/provided. Thereafter, the meta data is associated with the policy so that the constraints specified by the meta data can govern the modification of the policy. Under the present invention there are at least two ways of associating the meta data with a policy. In one embodiment, the meta data is embodied as a meta policy that can be associated with one or more (operational) policies. In another embodiment, the meta data is inserted into individual policies as additional attributes.

As used herein, the term "policy" is intended to refer to an operational policy or a set of rules/guidelines pertaining to the operation of a computer infrastructure. Under the present invention, the precise configuration of the computer infrastructure is not intended to be limiting. As known, a computer infrastructure can comprise any configuration of computer hardware and/or software such as servers, clients, databases, routers, etc.

As also indicated above, a policy under the present invention will have a set (e.g., one or more) of attributes. In a typical embodiment, each policy will have four attributes. Such attributes generally include: (1) scope; (2) precondition; (3) decision; and (4) business value (although some embodiments may lack one or more attribute). The scope attribute specifies the intended target of the policy. That is, the scope specifies the element of the computer infrastructure (e.g., server, database, application component, etc.) to which the policy is to be applied. The precondition attribute specifies when the policy is to be applied. For example, the policy might be applicable when CPU consumption of the element specified in the scope reaches a certain threshold, when recovery time for a system becomes too high, etc. The decision attribute specifies a specific action to be taken if the precondition occurs. For example, if the precondition is a CPU consumption of 60% for a server, the decision attribute could require shifting workload to a different server. Lastly, the business value attribute specifies a business value for the policy. This allows a priority to be determined when more than one policies are applicable.

Referring now to FIG. 1, an illustrative diagram 10 showing the autonomic implementation of a policy under the present invention is shown. As depicted, a policy could be implemented by multiple autonomic managers 12A-B and resource manager 14. Autonomic manager 12A is a solution level autonomic manager that accepts higher level business goals, translates business policies into goals and objectives for the resource it is managing, and pushes the goals down onto its managed elements. Autonomic Manager 12B is a touchpoint level autonomic manager that accepts the goals from autonomic manager 12A, translates the goals into effectors to be pressed, pushes down onto the effectors, and measures the goals using sensors. Resource manager 14 will accept the decisions from autonomic manager 12B and manage the resources of the computer infrastructure accordingly. Although not shown, an individual such as an administrator could push the policy down.

Figure 2:
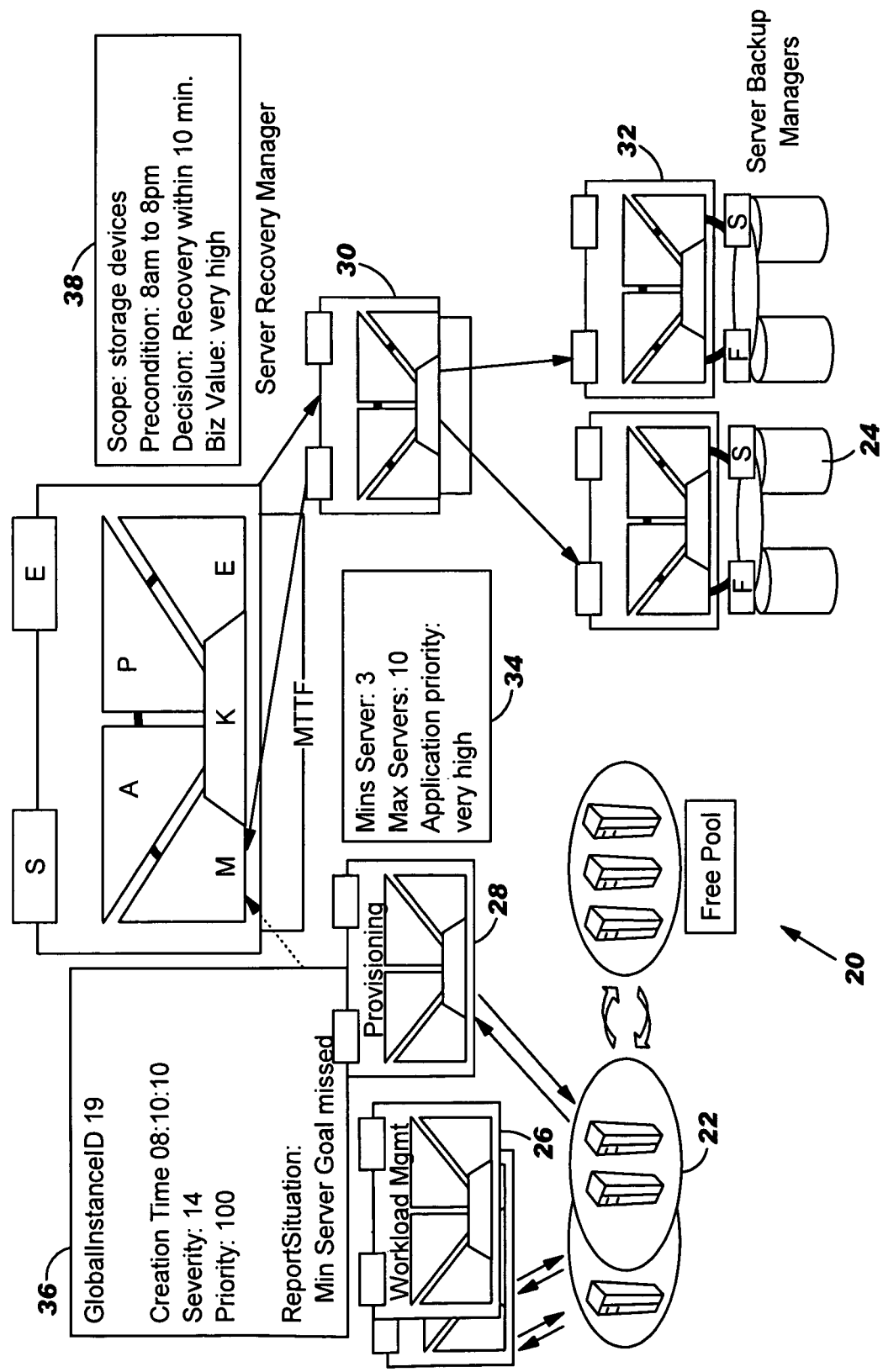
FIG. 2 depicts an illustrative scenario in which a policy is modified.

In general, policies often require modification to improve the operation of the computer infrastructure. For example, it could be the case that a recovery time specified within a policy is too long and needs to be reduced. FIG. 2 demonstrates this scenario in greater detail. Specifically, FIG. 2 shows a computer infrastructure 20 (or part of one) comprising servers 22 and storage devices 24. FIG. 2 also shows various autonomic systems such as a workload manager 26, a provisioning system 28, a server recovery manager 30 and a server backup manager 32. Also, computer infrastructure 20 has a requirement 34 that between 3 and 10 servers should be operational at any one time. Assume in this example that maintaining the minimum number of servers in operation is a function of recovery time of storage devices 34, as indicated in policy 38. Further, assume that an error message 36 has been generated because the server requirement has been missed (e.g., only 2 servers are operational).

In this scenario, an administrator or other personnel could attempt to modify policy 38 to reduce the recovery time from 10 minutes to 5 minutes. Unfortunately, the administrator would have to know whether the new recovery time of 5 minutes is feasible. Given the quantity of policies a single infrastructure could have, requiring the administrator to know the modification constraints, or be able to reference the constraints, is highly inefficient. The present invention provides a more effective way to impose modification constraints on policies.

Figure 3:
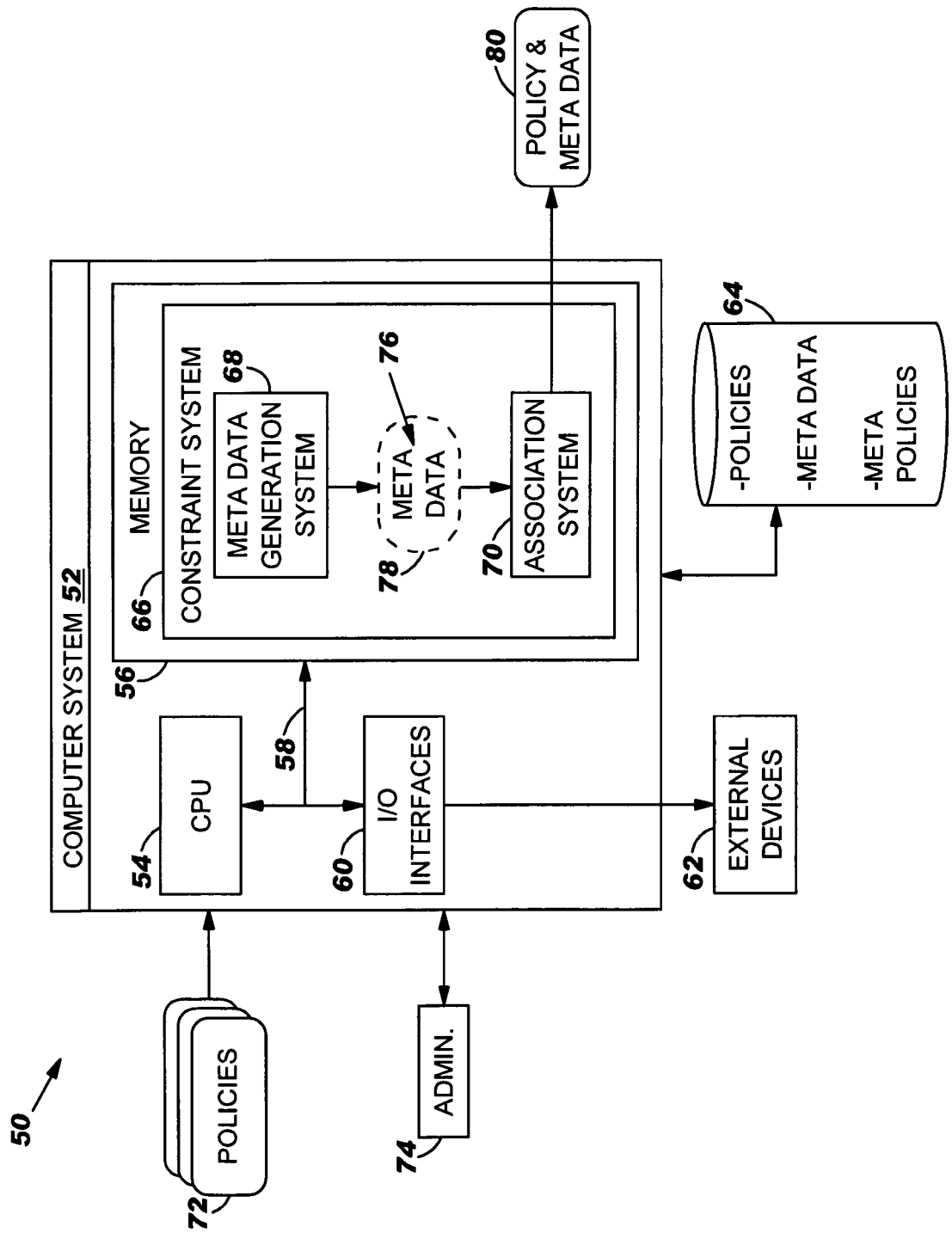
FIG. 3 depicts an illustrative system for imposing policy modification constraints according to the present invention.

Specifically, referring to FIG. 3, a system 50 for imposing modification constraints on policies 72 is depicted. As shown, system 50 includes a computer system 52, that generally comprises central processing unit (CPU) 54, memory 56, bus 58, input/output (I/O) interfaces 60, external devices/resources 62 and storage unit 64. CPU 54 may comprise a single processing unit, or be distributed across one or more processing units in one or more locations, e.g., on a client and server. Memory 56 may comprise any known type of data storage and/or transmission media, including magnetic media, optical media, random access memory (RAM), read-only memory (ROM), a data cache, etc. Moreover, similar to CPU 54, memory 56 may reside at a single physical location, comprising one or more types of data storage, or be distributed across a plurality of physical systems in various forms.

I/O interfaces 60 may comprise any system for exchanging information to/from an external source. External devices/resources 62 may comprise any known type of external device, including speakers, a CRT, LCD screen, handheld device, keyboard, mouse, voice recognition system, speech output system, printer, monitor/display, facsimile, pager, etc. Bus 58 provides a communication link between each of the components in computer system 12 and likewise may comprise any known type of transmission link, including electrical, optical, wireless, etc.

Storage unit 64 can be any system (e.g., database) capable of providing storage for information under the present invention. Such information could include, for example, a policies, meta data, meta policies, etc. As such, storage unit 64 could include one or more storage devices, such as a magnetic disk drive or an optical disk drive. In another embodiment, storage unit 64 includes data distributed across, for example, a local area network (LAN), wide area network (WAN) or a storage area network (SAN) (not shown). Although not shown, additional components, such as cache memory, communication systems, system software, etc., may be incorporated into computer system 52.

It should be understood that the teachings described herein could be implemented on a stand-alone computer system 52 as shown in FIG. 1, or over a network in a client-server environment. In the case of the latter, the client and server could communicate over any type of network such as the Internet, a local area network (LAN), a wide area network (WAN), a virtual private network (VPN), etc. As such, communication between the client and server could occur via a direct hardwired connection (e.g., serial port), or via an addressable connection that may utilize any combination of wireline and/or wireless transmission methods. Moreover, conventional network connectivity, such as Token Ring, Ethernet, WiFi or other conventional communications standards could be used. Still yet, connectivity could be provided by conventional TCP/IP sockets-based protocol. In this instance, the client could utilize an Internet service provider to establish connectivity to the server.

Regardless, shown in memory 56 is constraint system 66, which includes meta data generation system 68 and association system 70. Under the present invention, modification constraints will be imposed on one or more policies 72 by associating meta data corresponding to the modification constraints with the one or more policies 72. For example, assume that administrator 74 wishes to impose a modification constraint on a specific policy such as policy 38 of FIG. 2. Specifically, assume that administrator wishes to impose the modification constraint that will prevent the recovery time stated in the policy from being reduced below 7.5 minutes. Under the present invention, administrator 74 will use meta data generation system 68 to generate meta data 76 specifying the modification constraint. It should be understood, that meta data 76 can be generated to specify any quantity of modification constraints. A single modification constraint is discussed herein for illustrative purposes only. In any event, in a preferred embodiment, the meta data 76 is embodied by meta data generation system 68 as a meta policy 78 that can be associated with the policy as a whole by association system 70. This allows multiple policies 72 to be associated with the modification constraint(s) specified in meta policy 78. Specifically, when embodied as a meta policy 78, the modification constraints can be made applicable to classes or hierarchies of policies. For example, meta policy 78 (i.e., the modification constraint therein) could be made applicable to all policies concerning "servers."

In another embodiment, the meta data 76 is not embodied as a meta policy, rather is left as meta data 76. In this case, the meta data specifying the modification constraint can be inserted into the applicable policies as an additional attribute. For example if meta data 76 specifies one modification constraint, it will be inserted (via association system 70) into each individual the policy with which administrator 74 wishes it to be associated as a fifth attribute. Similarly, if meta data 76 specified two modification constraints, they would be inserted into each policy as the fifth and sixth attributes. Regardless, once the meta data has been associated with the policy (e.g., as meta policy 78 or as plain meta data 76), the associated pair 80 can be exported for use. If someone later attempts to modify the policy contrary to the modification constraint(s) associated therewith, an error message can be generated. For example, if someone later attempts to reduce the recover time set forth in policy 38 below 7.5 minutes, the attempted modification would not be permitted.

It should be understood that the present invention can be realized in hardware, software, or a combination of hardware and software. Any kind of computer system(s)—or other apparatus adapted for carrying out the methods described herein—is suited. A typical combination of hardware and software could be a general purpose computer system with a computer program that, when loaded and executed, carries out the respective methods described herein. Alternatively, a specific use computer, containing specialized hardware for carrying out one or more of the functional tasks of the invention, could be utilized. The present invention can also be embedded in a computer program product, which comprises all the respective features enabling the implementation of the methods described herein, and which—when loaded in a computer system—is able to carry out these methods. Computer program, software program, program, or software, in the present context mean any expression, in any language, code or notation, of a set of instructions intended to cause a system having an information processing capability to perform a particular function either directly or after either or both of the following: (a) conversion to another language, code or notation; and/or (b) reproduction in a different material form.

The foregoing description of the preferred embodiments of this invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of this invention as defined by the accompanying claims. For example, the illustrative representation of constraint system 66 shown in FIG. 3 is not intended to be limiting. That is, the functions of the present invention described herein could be represented by a different configuration of systems.

We claim:

1. A method for imposing policy modification constraints, comprising:
   providing in a database a policy pertaining to operational performance of a computer infrastructure,
   wherein the policy comprises a set of the attributes describing operational limitations of the computer infrastructure;
   associating in the database meta data with the policy, wherein the meta data specifies at least one modification constraint governing modification of at least one of the set of attributes;
   detecting by a processor of a computer an attempt to modify the policy with a value for one of the attributes and determining if the value is not permitted by the meta data; and,
   responsive to determining that the value is not permitted by the meta data, disallowing the modification of the policy but otherwise applying the modification to the policy in the database,
   wherein the meta data is embodied as a meta policy, and wherein the associating step comprises associating the meta policy with the policy.

2. The method of claim 1, wherein the associating step comprises inserting the at least one modification constraint into the policy as at least one an additional attribute.

3. The method of claim 1, wherein the set of attributes comprises the attributes of scope, precondition, decision and business value.

4. The method of claim 3, wherein the attribute of scope specifies an element of the computer infrastructure that is subject to the policy.

5. The method of claim 3, wherein the attribute of precondition specifies when the policy is to be applied to the computer infrastructure.

6. The method of claim 3, wherein the attribute of decision specifies an action to be taken if the attribute of precondition occurs.

7. The method of claim 3, wherein the attribute of business value specifies a business value of the policy.

8. A computer-implemented method for imposing policy modification constraints, comprising:
    providing in a database a policy pertaining to operational performance of a computer infrastructure describing operational limitations of the computer infrastructure, wherein the policy comprises at least one of attributes of scope, precondition, decision and business value;
    generating meta data that specifies at least one modification constraint governing modification of at least one of the attributes; and
    associating in the database meta data with the policy, wherein the meta data specifies at least one modification constraint governing modification of at least one of the set of attributes;
    detecting by a processor of a computer an attempt to modify the policy with a value for one of the attributes and determining if the value is not permitted by the meta data; and,
    responsive to determining that the value is not permitted by the meta data,
    disallowing the modification of the policy but otherwise applying the modification to the policy in the database,
    wherein the meta data is embodied as a meta policy, and wherein the associating step comprises associating the meta policy with the policy.

9. The method of claim 8, wherein the associating step comprises inserting the at least one modification constraint into the policy as at least one an additional attribute.

10. The method of claim 8, wherein the meta data is embodied as a meta policy, and wherein the associating step comprises associating the meta policy with the policy.

11. The method of claim 8, wherein the attribute of scope specifies an element of the computer infrastructure that is subject to the policy.

12. The method of claim 8, wherein the attribute of precondition specifies when the policy is to be applied to the computer infrastructure.

13. The method of claim 8, wherein the attribute of decision specifies an action to be taken if the attribute of precondition occurs.

14. The method of claim 8, wherein the attribute of business value specifies a business value of the policy.

* * * * *